United States Patent [19]
McDonald

[11] Patent Number: 5,831,459
[45] Date of Patent: Nov. 3, 1998

[54] METHOD AND SYSTEM FOR ADJUSTING A CLOCK SIGNAL WITHIN ELECTRONIC CIRCUITRY

[75] Inventor: Thomas Colvin McDonald, Austin, Tex.

[73] Assignee: International Business Machines Corporation, Armonk, N.Y.

[21] Appl. No.: 878,453

[22] Filed: Jun. 18, 1997

Related U.S. Application Data

[63] Continuation of Ser. No. 557,400, Nov. 13, 1995, abandoned.

[51] Int. Cl.$^6$ ................................................ H03K 5/13
[52] U.S. Cl. .......................... 327/141; 327/144; 327/152; 327/276; 327/291
[58] Field of Search ..................................... 327/292, 293, 327/295, 155, 156, 158, 159, 261, 269, 270, 276, 277, 243–245, 291, 141, 144, 152, 153

[56] References Cited

U.S. PATENT DOCUMENTS

| 4,415,984 | 11/1983 | Gryger et al. | 364/900 |
| 4,812,684 | 3/1989 | Yamagiwa et al. | 307/480 |
| 4,914,429 | 4/1990 | Upp | 340/825.8 |
| 5,223,755 | 6/1993 | Richley | 307/603 |
| 5,239,215 | 8/1993 | Yamaguchi | 307/480 |
| 5,278,873 | 1/1994 | Lowrey et al. | 375/118 |
| 5,296,748 | 3/1994 | Wicklund et al. | 307/303.1 |
| 5,307,381 | 4/1994 | Ahuja | 327/292 |
| 5,387,825 | 2/1995 | Cantrell et al. | 327/292 |
| 5,396,111 | 3/1995 | Frangioso et al. | 327/295 |
| 5,420,544 | 5/1995 | Ishibashi | 327/293 |
| 5,430,397 | 7/1995 | Itoh et al. | 327/295 |
| 5,444,405 | 8/1995 | Truong et al. | 327/293 |
| 5,489,867 | 2/1996 | Tamanoi | 327/270 |
| 5,519,351 | 5/1996 | Matsumoto | 327/293 |
| 5,521,541 | 5/1996 | Okamura | 327/292 |
| 5,548,620 | 8/1996 | Rogers | 327/145 |

FOREIGN PATENT DOCUMENTS

| 53-53521 | 11/1979 | Japan | 327/276 |
| 2199918 | 8/1990 | Japan | 327/270 |
| 3175720 | 7/1991 | Japan | 327/276 |
| 4-150612 | 5/1992 | Japan | 327/291 |
| 4207215 | 7/1992 | Japan | 327/277 |

OTHER PUBLICATIONS

IBM Technical Disclosure Bulletin, vol. 30, No. 2, Jul. 1987 "Scheme for Reducing Clock Skew In Multiple—Chip System Design".

Primary Examiner—Timothy P. Callahan
Assistant Examiner—T. T. Lam
Attorney, Agent, or Firm—Michael A. Davis, Jr.; Casimer K. Salys

[57] ABSTRACT

A method and system are provided. A clock signal is input and output at first and second nodes of integrated circuitry. The first node is connected through a selected one of a plurality of metallization paths of the integrated circuitry to the second node. Each of the metallization paths is connectable between the first and second nodes for delaying the clock signal by a respective amount of time between the first and second nodes, so that the clock signal at the second node is always delayed relative to the first node by the respective amount of time of the selected metallization path.

3 Claims, 9 Drawing Sheets

METHOD AND SYSTEM FOR ADJUSTING A CLOCK SIGNAL WITHIN ELECTRONIC CIRCUITRY

This is a continuation of application Ser. No. 08/557,400 filed Nov. 13, 1995 now abandoned.

TECHNICAL FIELD

This patent application relates in general to electronic circuitry and in particular to a method and system for adjusting a clock signal within electronic circuitry.

BACKGROUND OF THE INVENTION

Clock skew can be defined as a difference between arrival times of a clock signal at various portions of electronic circuitry that input and respond to the clock signal. Clock skew has conventionally been regarded as a penalty that directly reduces the electronic circuitry's cycle time. Accordingly, designers of high-speed microprocessors have attempted to selectively reduce clock skew to accommodate critical paths within integrated electronic circuitry.

To adjust clock skew within an integrated circuit, previous techniques have attempted to manually edit a global clock metallization, so that metallization delays are selectively increased or reduced. Such previous manual techniques are very time-consuming. Accordingly, with constraints on project development schedules, such previous techniques are practical for only a few signal paths.

For example, manual edits to the global clock metallization may be needed at a final stage of development in an integrated circuitry project, perhaps within only a few days of attempts to fabricate the integrated circuitry. This is particularly true where the metallization is not sufficiently defined before the project's final stage. In such a situation, an insufficient amount of time might remain (before the fabrication attempts) to manually edit the global clock metallization.

Also, in such a situation, while such manual editing might be capable of speeding clock signal distribution by 200–300 picoseconds ("ps"), it can be impractical to slow the clock signal distribution. This is because slowing the clock signal distribution can require extra routing to be added to an integrated circuit's floorplan. However, such extra routing can be impractical if the floorplan is already occupied by very dense metallization.

Accordingly, only limited success can be practically achieved toward adjusting the clock skews by manually editing the global clock metallization. Although a particular worst case critical path on integrated circuitry might be improved, such manual editing of the global clock metallization can be too cumbersome and time-consuming for practical application on a larger scale with numerous signal paths.

Thus, a need has arisen for a method and system for adjusting a clock signal within electronic circuitry, in which clock skew can be readily adjusted in a more practical manner within integrated circuitry, relative to previous techniques. Also, a need has arisen for a method and system for adjusting a clock signal within electronic circuitry, in which clock skew can be readily adjusted in a less cumbersome and less time-consuming manner, relative to previous techniques. Further, a need has arisen for a method and system for adjusting a clock signal within electronic circuitry, in which clock skew can be readily adjusted so that critical paths are accommodated for numerous signal paths on a larger scale, relative to previous techniques.

SUMMARY OF THE INVENTION

A clock signal is input and output at first and second nodes of integrated circuitry. The first node is connected through a selected one of a plurality of metallization paths of the integrated circuitry to the second node. Each of the metallization paths is connectable between the first and second nodes for delaying the clock signal by a respective amount of time between the first and second nodes, so that the clock signal at the second node is always delayed relative to the first node by the respective amount of time of the selected metallization path.

It is a technical advantage of the present invention that clock skew can be readily adjusted in a more practical manner within integrated circuitry, relative to previous techniques.

It is another technical advantage of the present invention that clock skew can be readily adjusted in a less cumbersome and less time-consuming manner, relative to previous techniques.

It is a further technical advantage of the present invention that clock skew can be readily adjusted so that critical paths are accommodated for numerous signal paths on a larger scale, relative to previous techniques.

BRIEF DESCRIPTION OF THE DRAWINGS

An illustrative embodiment of the present inventions and their advantages are better understood by referring to the following descriptions and accompanying drawings, in which.

DETAILED DESCRIPTION

An illustrative embodiment of the present inventions and their advantages are better understood by referring to FIGS. 1–7 of the drawings, like alphanumeric characters being used for like and corresponding parts of the accompanying drawings.

Figure 1:
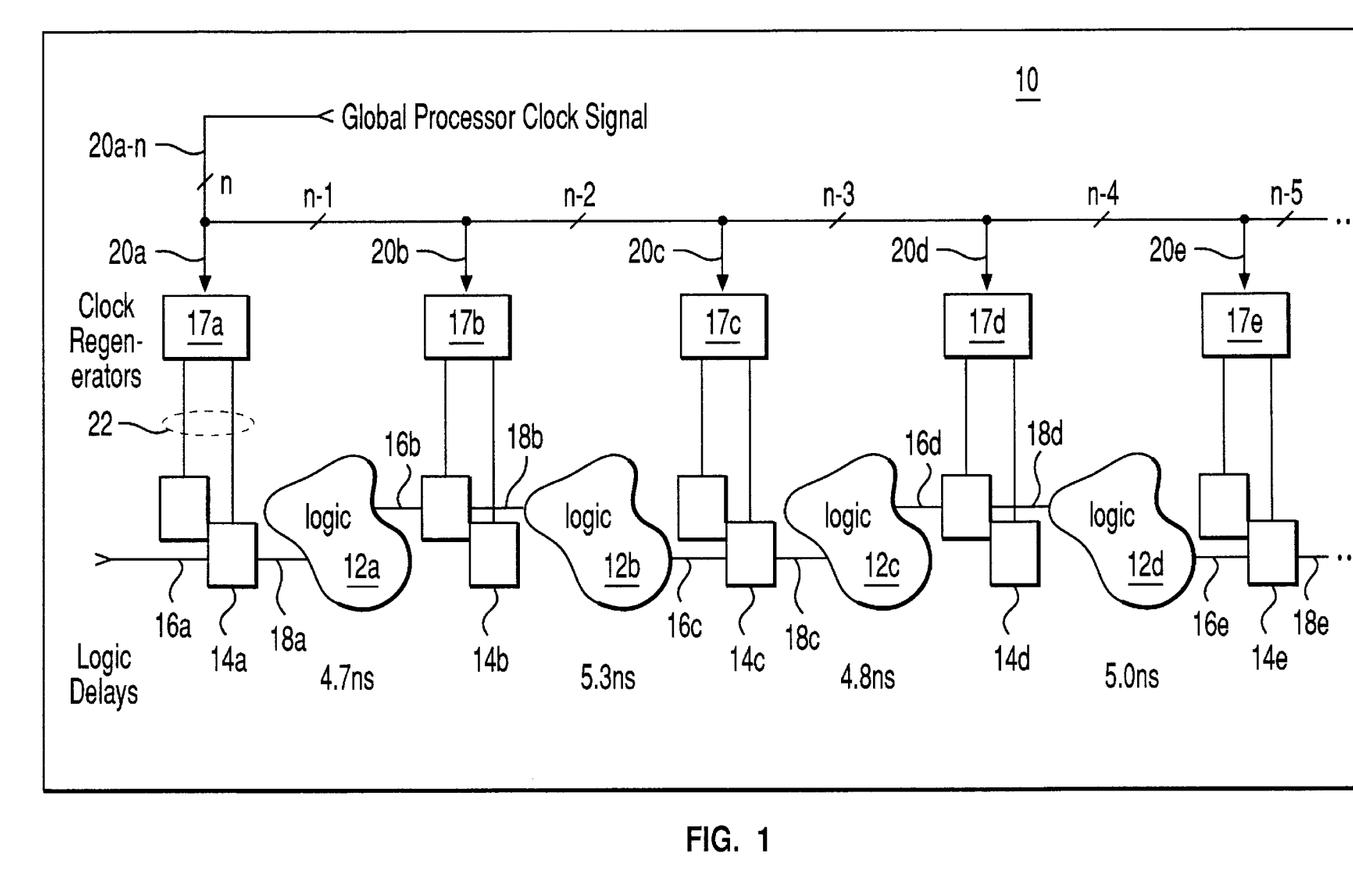
FIG. 1 is a block diagram of multiple logic stages within an electronic system of the illustrative embodiment.

FIG. 1 is a block diagram of multiple logic stages 12a–d within an electronic system 10. In the illustrative embodiment, system 10 is a single integrated circuit. Accordingly, logic stages 12a–d are circuitry integral with one another. Moreover, in the illustrative embodiment, system 10 is a superscalar RISC microprocessor. Accordingly, system 10 further includes other circuitry (not shown in FIG. 1 for clarity) for implementing various functions of the superscalar microprocessor.

An L2 latch of a conventional L1/L2 latch 14a inputs a signal through a line 16a from other circuitry (not shown in FIG. 1 for clarity) of system 10. In response to a local clocking signal from a clock regenerator 17a, the L2 latch of L1/L2 latch 14a outputs the signal (from line 16a) to logic stage 12a through a line 18a. Logic stage 12a inputs the signal from line 18a and outputs a signal through a line 16b in response thereto.

An L1 latch of a conventional L1/L2 latch 14b inputs the signal from line 16b. In response to a local clocking signal from a clock regenerator 17b, the L1 latch of L1/L2 latch 14b outputs the signal (from line 16b) to logic stage 12b through a line 18b. Logic stage 12b inputs the signal from line 18b and outputs a signal through a line 16c in response thereto.

An L2 latch of a conventional L1/L2 latch 14c inputs the signal from line 16c. In response to a local clocking signal from a clock regenerator 17c, the L2 latch of L1/L2 latch 14c outputs the signal (from line 16c) to logic stage 12c through a line 18c. Logic stage 12c inputs the signal from line 18c and outputs a signal through a line 16d in response thereto.

An L1 latch of a conventional L1/L2 latch 14d inputs the signal from line 16d. In response to a local clocking signal from a clock regenerator 17d, the L1 latch of L1/L2 latch 14d outputs the signal (from line 16d) to logic stage 12d through a line 18d. Logic stage 12d inputs the signal from line 18d and outputs a signal through a line 16e in response thereto.

An L2 latch of a conventional L1/L2 latch 14e inputs the signal from line 16e. In response to a local clocking signal from a clock regenerator 17e, the L2 latch of L1/L2 latch 14e outputs the signal (from line 16e) to logic (not shown in FIG. 1 for clarity) through a line 18e.

Figure 2:
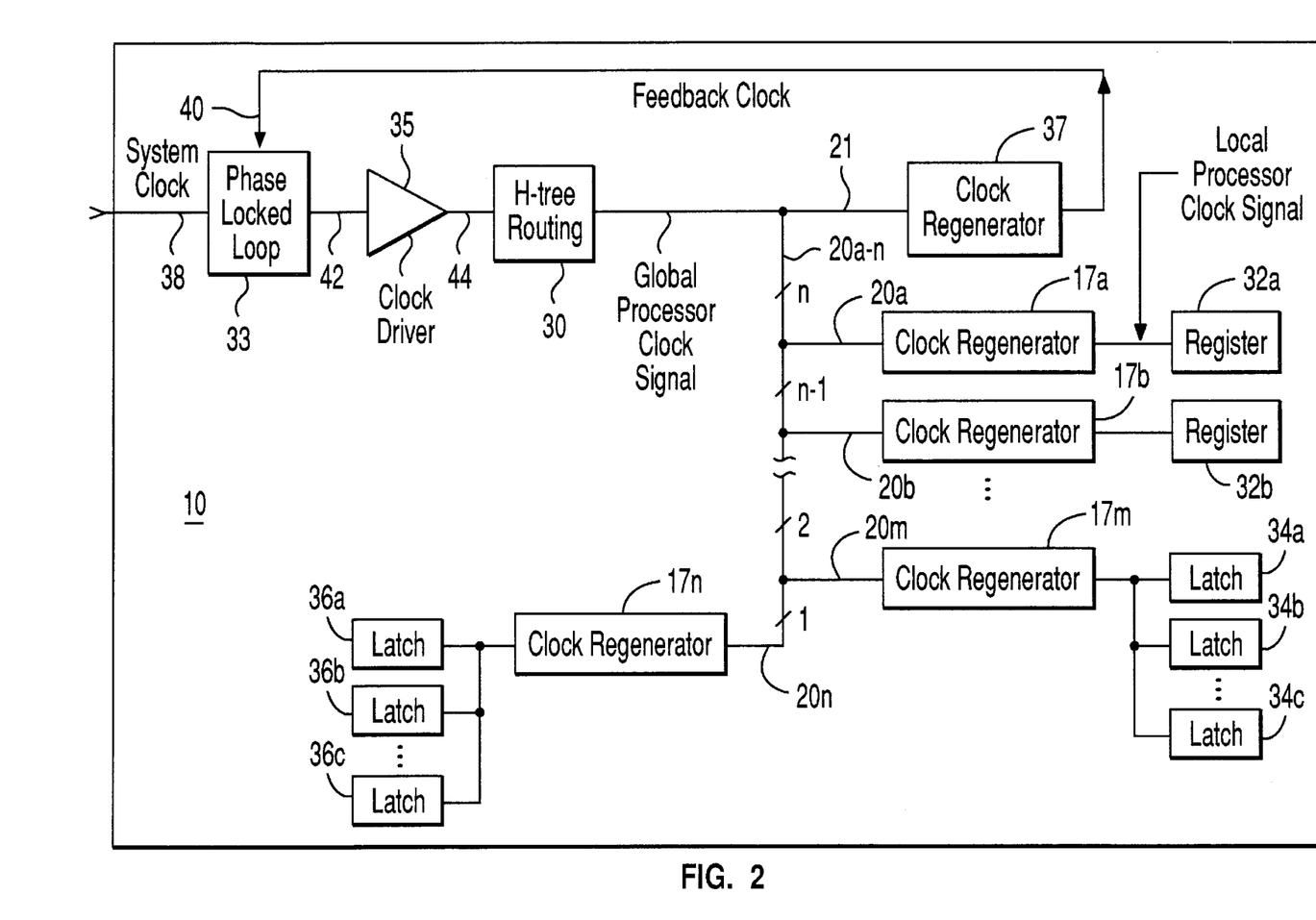
FIG. 2 is a block diagram of clocking circuitry of the system of FIG. 1.

FIG. 2 is a block diagram of clocking circuitry of system 10. More particularly, the clocking circuitry of system 10 includes H-tree routing circuitry 30, phase locked loop circuitry 33, clock driver circuitry 35, and a clock regenerator 37. As shown in FIG. 2, the global processor clock signal (also shown in FIG. 1) is output by H-tree routing circuitry 30 through lines 20a–n and 21.

In design and implementation, clock regenerator 37 is substantially identical in design and implementation to clock regenerator 17a discussed further herein in connection with FIG. 1. Accordingly, as shown in FIG. 2, clock regenerator 37 inputs the global processor clock signal from H-tree routing circuitry 30 through line 21 and suitably outputs a feedback local clock signal through a line 40 in response thereto. Since clock regenerator 37 is substantially identical (in design and implementation) to clock regenerator 17a, the feedback local clock signal (output by clock regenerator 37 on line 40) is substantially identical to the local clock signal output by clock regenerator 17a on a predetermined one of lines 22 (discussed further hereinbelow in connection with FIG. 1).

In operation, phase locked loop circuitry 33 inputs a system clock signal through a line 38 from other circuitry external to system 10, as for example from another integrated circuit external to system 10. Moreover, phase locked loop circuitry 33 inputs the feedback local clock signal through line 40 from clock regenerator 37. In response to the system clock signal and the feedback local clock signal, phase locked loop circuitry 33 outputs a logical processor clock signal through a line 42, such that the logical processor clock signal on line 42 has (a) a predetermined phase relationship to the system clock signal on line 38 and (b) a frequency which is a predetermined ratio of the system clock signal's frequency.

Clock driver circuitry 35 inputs the logical processor clock signal from line 42 and outputs the global processor clock signal through a line 44. Logically, the global processor clock signal on line 44 is substantially identical to the logical processor clock signal on line 42, yet the global processor clock signal has a higher electrical current sourcing capacity through line 44 and is slightly time-delayed relative to the logical processor clock signal on line 42.

In the illustrative embodiment, H-tree routing circuitry 30 distributes the global processor clock signal throughout the integrated circuitry of system 10 to several hundred clock regenerators (e.g. 17a–n). In response to the global processor clock signal, clock regenerators 17a–n output respective local clock signals to other elements of the integrated circuitry of system 10.

For example, other elements of the integrated circuitry of system 10 include dataflow elements (e.g. registers 32a and 32b) and synthesized memory elements (e.g. latches 34a–c and 36a–c). In the example of FIGS. 1 and 2, register 32a (FIG. 2) includes L1/L2 latch 14a (FIG. 1), and register 32b (FIG. 2) includes L1/L2 latch 14b. As shown in FIG. 2, each of registers 32a and 32b is connected to a respective one of clock regenerators 17a (connected to register 32a) and 17b (connected to register 32b). By comparison, multiple latches 34a–c are connected to clock regenerator 17m, and multiple latches 36a–c are connected to clock regenerator 17n, as shown in FIG. 2.

Figure 3:
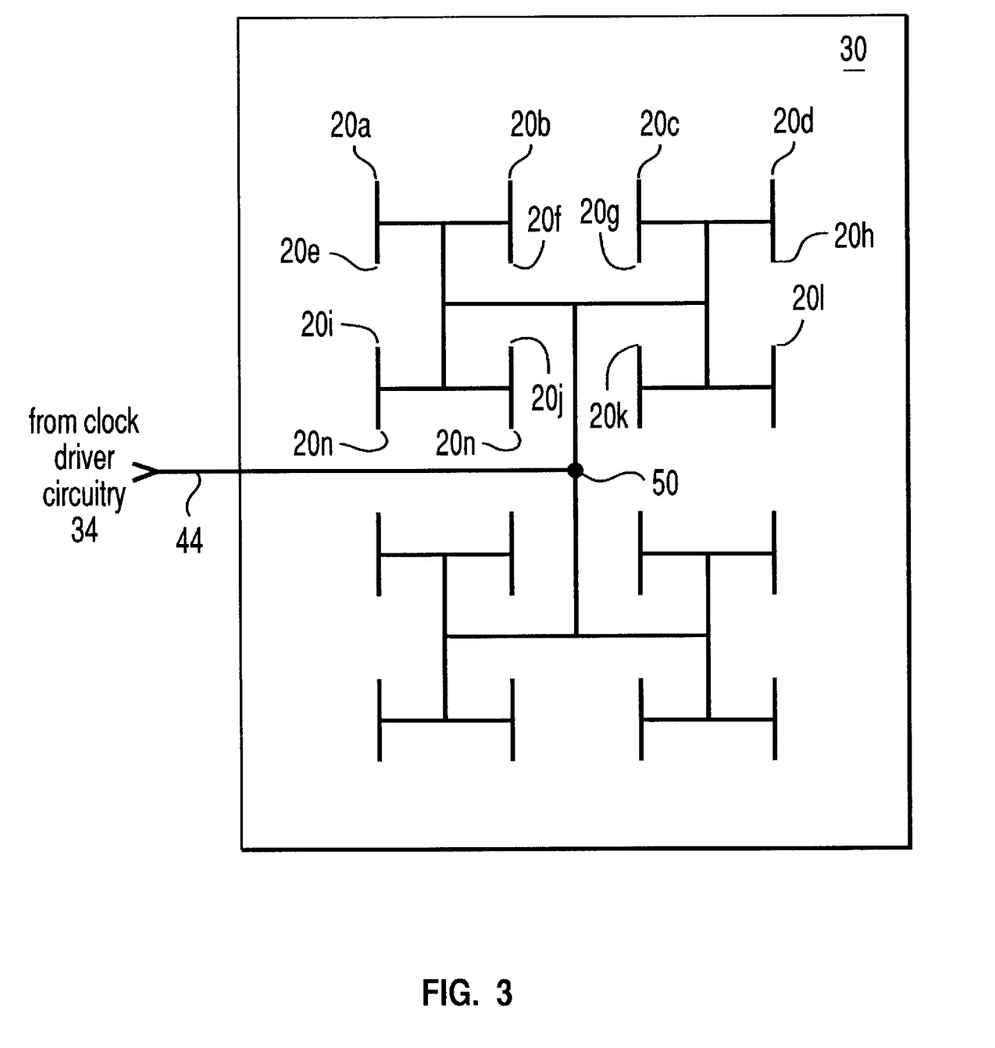
FIG. 3 is a conceptual illustration of H-tree routing circuitry of the clocking circuitry of FIG. 2.

FIG. 3 is a conceptual illustration of conventional H-tree routing circuitry 30. Referring to FIGS. 1–3, H-tree routing circuitry 30 inputs the global processor clock signal from line 44. H-tree routing circuitry 30 inputs the global processor clock signal on line 44 through a single global processor clock node 50 and outputs the global processor clock signal through multiple lines 20a–n, where n is a number of clock regenerators within system 10 which input the global processor clock from H-tree routing circuitry 30. In the illustrative embodiment, n>500 in the integrated circuitry of system 10, so for clarity FIGS. 1–3 show only a subset of such components.

Accordingly, as shown in FIGS. 1 and 2, each of clock regenerators 17a–n is connected to a respective one of lines 20a–n from which it inputs the global processor clock signal. Clock regenerator 17a is a representative one of clock regenerators 17a–n. As an example, clock regenerator 17a inputs the global processor clock signal from line 20a and suitably outputs local clocking signals in response thereto through lines 22 to L1/L2 latch 14a as shown in FIG. 1.

FIGS. 1 and 2 are not drawn to scale. In the illustrative embodiment, H-tree routing circuitry 30 is designed and implemented so that the global processor clock signal propagates substantially identically through all lines 20a–n and is received by all clock regenerators (e.g. 17a–n) substantially simultaneously. Accordingly, in the illustrative embodiment, H-tree routing circuitry 30 is designed and implemented to evenly distribute the global processor clock signal to all clock regenerators (e.g. 17a–n) through lines 20a–n, such that each of lines 20a–n is substantially identical in length between its respectively connected clock regenerator and global processor clock node 50 (FIG. 3). Thus, in the illustrative embodiment, there is no clock skew between arrival times of the global processor clock signal at the respective inputs of clock regenerators 17a–n, so that clock regenerators 17a–n input the global processor clock signal substantially simultaneously.

Moreover, clock regenerators 17a–n are load-balanced. For example, if a register or group of latches applies a relatively large capacitive loading on a particular clock regenerator, then a driver stage of the particular clock regenerator is enlarged to accommodate such a capacitive loading. Such a technique helps reduce the clock skew otherwise resulting from different capacitive loads applied to the clock regenerators. In an example embodiment using such a technique, the clock skew is reduced to less than +/−100 picoseconds ("ps"), with only a few exceptions.

As shown in the example of FIG. 1, an internal delay through logic stage 12a is 4.7 nanoseconds ("ns"), such that the signal output by logic stage 12a through line 16b is always approximately 4.7 ns delayed relative to the signal input by logic stage 12a from line 18a. Thus, logic stage 12a has an internal delay of 4.7 ns. Similarly, logic stage 12b has an internal delay of 5.3 ns, logic stage 12c has an internal delay of 4.8 ns, and logic stage 12d has an internal delay of 5.0 ns. These delays assume that (a) each logic stage is architecturally fixed so that no circuitry of a particular logic stage is relocatable in a practical manner to another logic stage, and (b) each logic stage has been designed and implemented in a substantially optimized manner to be as fast as practically achievable with a selected process technology.

Each of logic stages 12a–d is constrained by the speed limitations of circuitry at its input and output nodes. For example, logic stage 12c is constrained by the speed limitations of logic stage 12b, because the L2 latch of L1/L2 latch 14c preferably delays outputting the signal (from line 16c) until after logic stage 12b inputs the signal from line 18b and outputs the signal through line 16c in response thereto.

As already mentioned hereinabove, clock regenerator 17a is a representative one of clock regenerators 17a–e. Likewise, L1/L2 latch 14a is a representative one of L1/L2 latches 14a–e. For clarity, it should be understood that the local clocking signals output by clock regenerator 17a on lines 22 are inverted from one another, so that the L1 latch of L1/L2 latch 14a operates in response to a predetermined edge (e.g. a falling edge) of the global processor clock signal. By comparison, the L2 latch of L1/L2 latch 14a operates in response to an edge (e.g. a rising edge) of the global processor clock signal which is opposite from such a predetermined edge.

For example, in the illustrative embodiment, in response to a falling edge of the global processor clock signal, the L1 latch of L1/L2 latch 14b outputs the signal from line 16b to logic stage 12b through line 18b. Likewise, in the illustrative embodiment, in response to a rising edge of the global processor clock signal, the L2 latch of L1/L2 latch 14c outputs the signal from line 16c to logic stage 12c through line 18c.

As shown in FIG. 1, in the illustrative embodiment, logic stage 12b inputs a signal from an L1 latch (of L1/L2 latch 14b) and outputs a signal to an L2 latch (of L1/L2 latch 14c). Likewise, logic stage 12d inputs a signal from an L1 latch and outputs a signal to an L2 latch. Similarly, each of logic stages 12a and 12c inputs a signal from an L2 latch and outputs a signal to an L1 latch. Consequently, each of logic stages 12a–d operates according to a half-cycle window.

Thus, the fastest possible cycle time of the circuitry of system 10 shown in FIG. 1 is 10.6 ns (i.e. 2×5.3 ns), because the slowest half-cycle logic stage 12b is 5.3 ns, with the following assumptions:

(1) no clock skew between arrival times of the global processor clock signal at the respective inputs of clock regenerators 17a–e, so that clock regenerators 17a–in-put the global processor clock signal substantially simultaneously;

(2) clock regenerators 17a–e are designed and implemented substantially identical to one another;

(3) the L1 and L2 latches of L1/L2 latches 14a–e are designed and implemented substantially identical to one another; and (4) the local clocking signals output by clock regenerators 17a–e each have a 50% duty cycle (i.e. a time for a falling edge to follow a rising edge is equal to a time for a rising edge to follow a falling edge).

Figure 4:
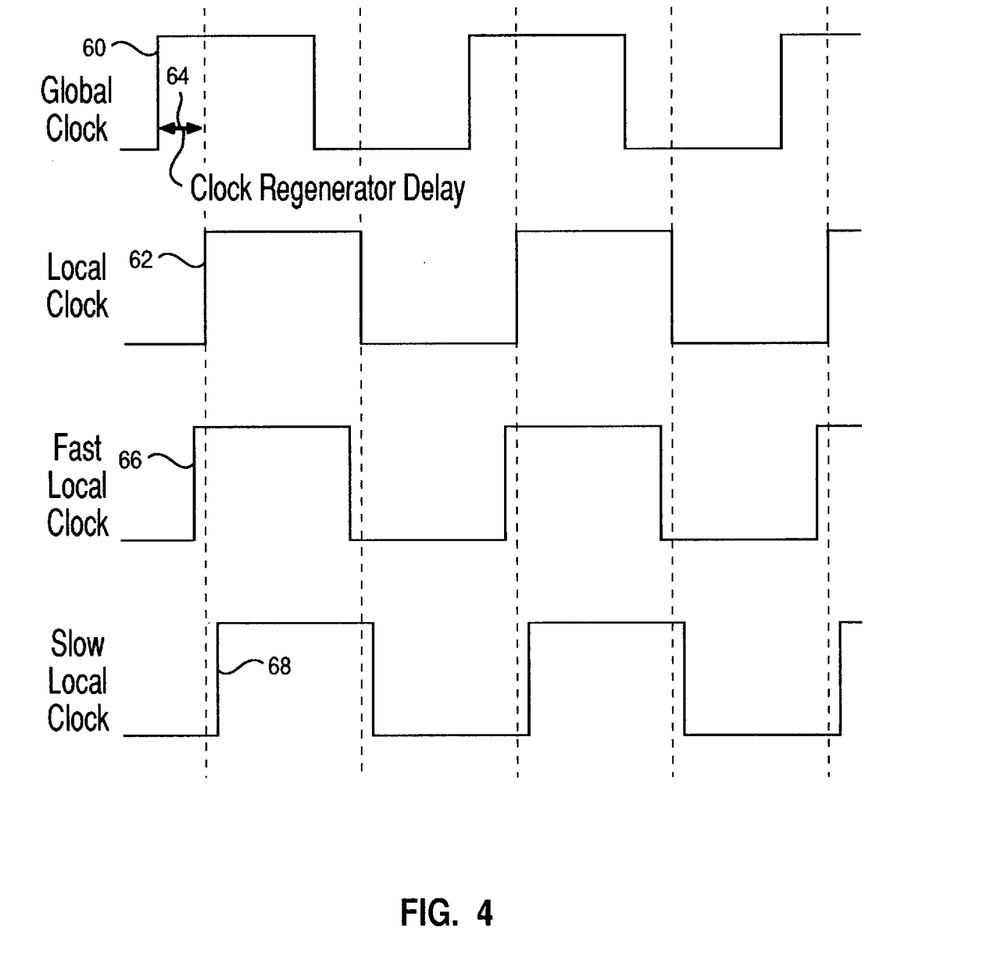
FIG. 4 is a timing diagram of clock signals within the system of FIG. 1.

FIG. 4 is a timing diagram of clock signals within system 10. More particularly, a waveform 60 in FIG. 4 shows the global processor clock signal on any of lines 20a–n and 21. Moreover, a waveform 62 in FIG. 4 shows the feedback local clock signal (output by clock regenerator 37 on line 40), which is substantially identical to the local clock signal output by clock regenerator 17a on a predetermined one of lines 22, and which is likewise substantially identical to local clock signals output by respective ones of clock regenerators 17b–n. As shown in FIG. 4, a clock regenerator delay 64 occurs between waveform 60 and waveform 62; clock regenerator delay 64 is a result of an internal delay through clock regenerator 37.

Nevertheless, assumption (1) above may result in a less-than-optimal cycle time (of the circuitry of system 10 shown in FIG. 1). Accordingly, the clock skew is adjustable to advantageously reduce the cycle time. Such adjustment of the clock skew is referenced herein as "clock skew optimization".

For example, if clock regenerator 17b outputs its local clocking signal to the input of the L1 latch of L1/L2 latch 14b 200 ps sooner than otherwise, then the L1 latch of L1/L2 latch 14b outputs the signal from line 16b to logic stage 12b through line 18b 200 ps sooner than otherwise. A waveform 66 in FIG. 4 shows the local clock signal output (200 ps sooner than waveform 62) by clock regenerator 17b after the local clocking signal is clock skewed in such a manner. Since logic stage 12a has an internal delay of only 4.7 ns, it retains the ability to accommodate such a situation where the local clocking signal is clock skewed to arrive at the input of the L1 latch of L1/L2 latch 14b 200 ps sooner than otherwise.

Similarly, if clock regenerator 17c outputs its local clocking signal to the input of the L2 latch of L1/L2 latch 14c 100 ps later than otherwise, then the L2 latch of L1/L2 latch 14c outputs the signal from line 16c to logic stage 12c through line 18c 100 ps later than otherwise. A waveform 68 in FIG. 4 shows the local clock signal output (100 ps later than waveform 62) by clock regenerator 17c after the local clocking signal is clock skewed in such a manner. Since logic stage 12c has an internal delay of only 4.8 ns, it retains the ability to accommodate such a situation where the local clocking signal is clock skewed to arrive at the input of the L2 latch of L1/L2 latch 14c 100 ps later than otherwise.

By skewing the local processor clock signals output from clock regenerators 17b and 17c as described in the immediately preceding two paragraphs, the cycle time (of the circuitry of system 10 shown in FIG. 1) can be reduced to 10.0 ns (i.e. a half-cycle time of 5.0 ns), while still affording half-cycle logic stage 12b (the slowest logic stage among logic stages 12a–d) a 5.3 ns time period in which to input the signal from line 18b and output a signal through line 16c in response thereto. This is because the 5.0 ns half-cycle time afforded to logic stage 12b is supplemented by an extra 200 ps (the L1 latch of L1/L2 latch 14b outputs the signal from line 16b to logic stage 12b through line 18b 200 ps sooner than otherwise) plus an extra 100 ps (the L2 latch of L1/L2 latch 14c outputs the signal from line 16c to logic stage 12c through line 18c 100 ps later than otherwise). In such a situation, each of the other logic stages (besides logic stage 12b) retains the same internal delay as before.

Such a clock skew optimization technique is similarly applicable to situations where logic stages operate according to a full-cycle window. For example, a first logic stage outputs a signal to an L1 latch of a conventional L1/L2 latch. At a later time, an L2 latch of the L1/L2 latch outputs the signal through a second logic stage to an L1 latch of another conventional L1/L2 latch.

FIGS. 5a–c, 6 and 7 are electrical circuit diagrams of clock regenerators according to clock skew optimization techniques of first, second and third illustrative embodiments, respectively. According to the techniques of FIGS. 5a–c, 6 and 7, local metallization-programmable delays are selectable to substantially optimize clock skew. Advantageously, the techniques of FIGS. 5a–c, 6 and 7 are readily adaptable to automated clock skew optimization.

Moreover, the clock skew optimization techniques of the illustrative embodiments are advantageous because the delay adjustments in FIGS. 5a–c, 6 and 7 are locally applied in an individualized manner within respective clock regenerators. This is particularly advantageous at or near the final stage of development in an integrated circuitry project, because only a relatively small amount of time is consumed while implementing the clock skew optimization techniques of the illustrative embodiments.

Figure 5A:
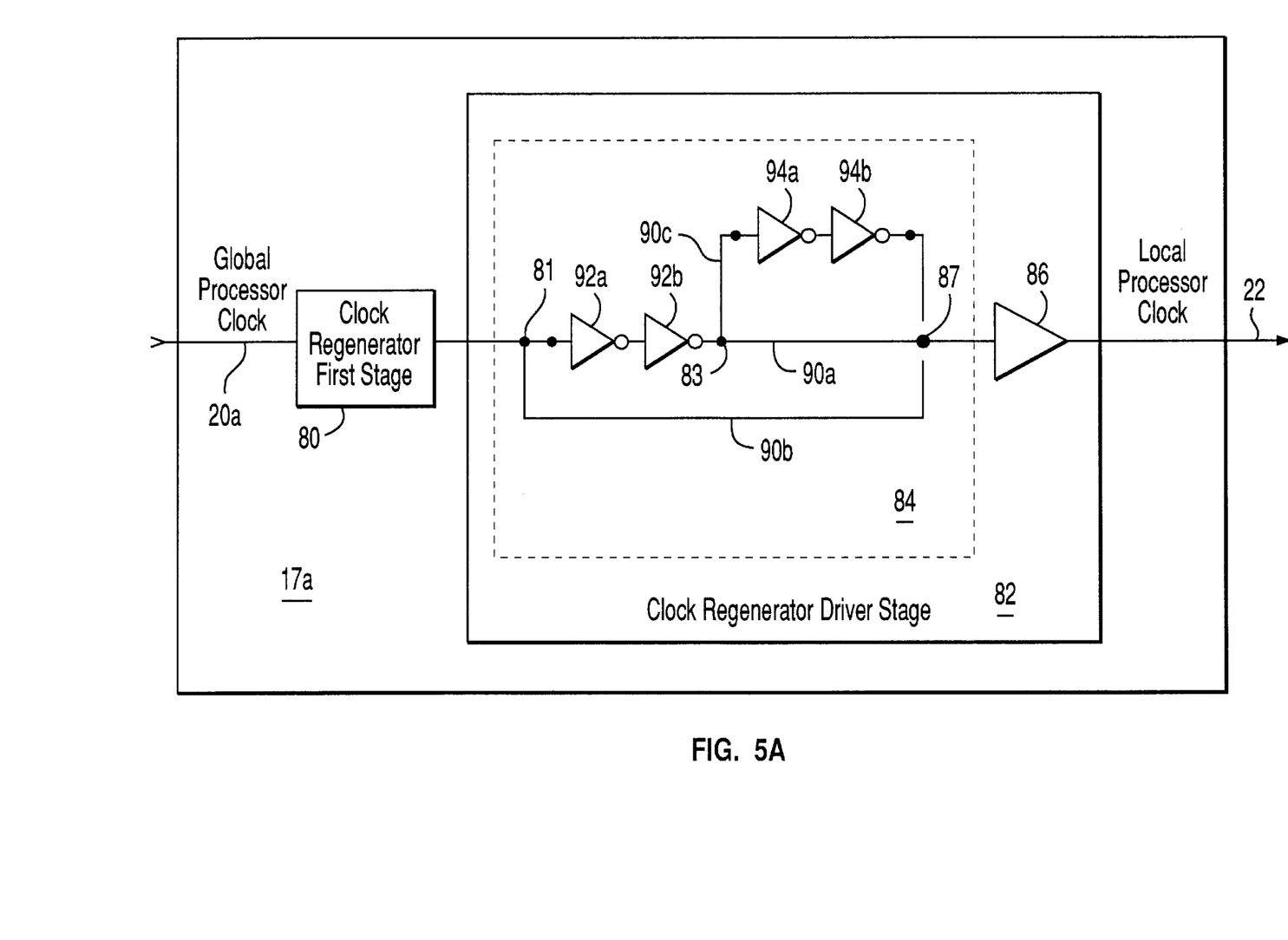
FIGS. 5a–c are electrical circuit diagrams of clock regenerators according to a clock skew optimization technique of a first illustrative embodiment.
Figure 5B:
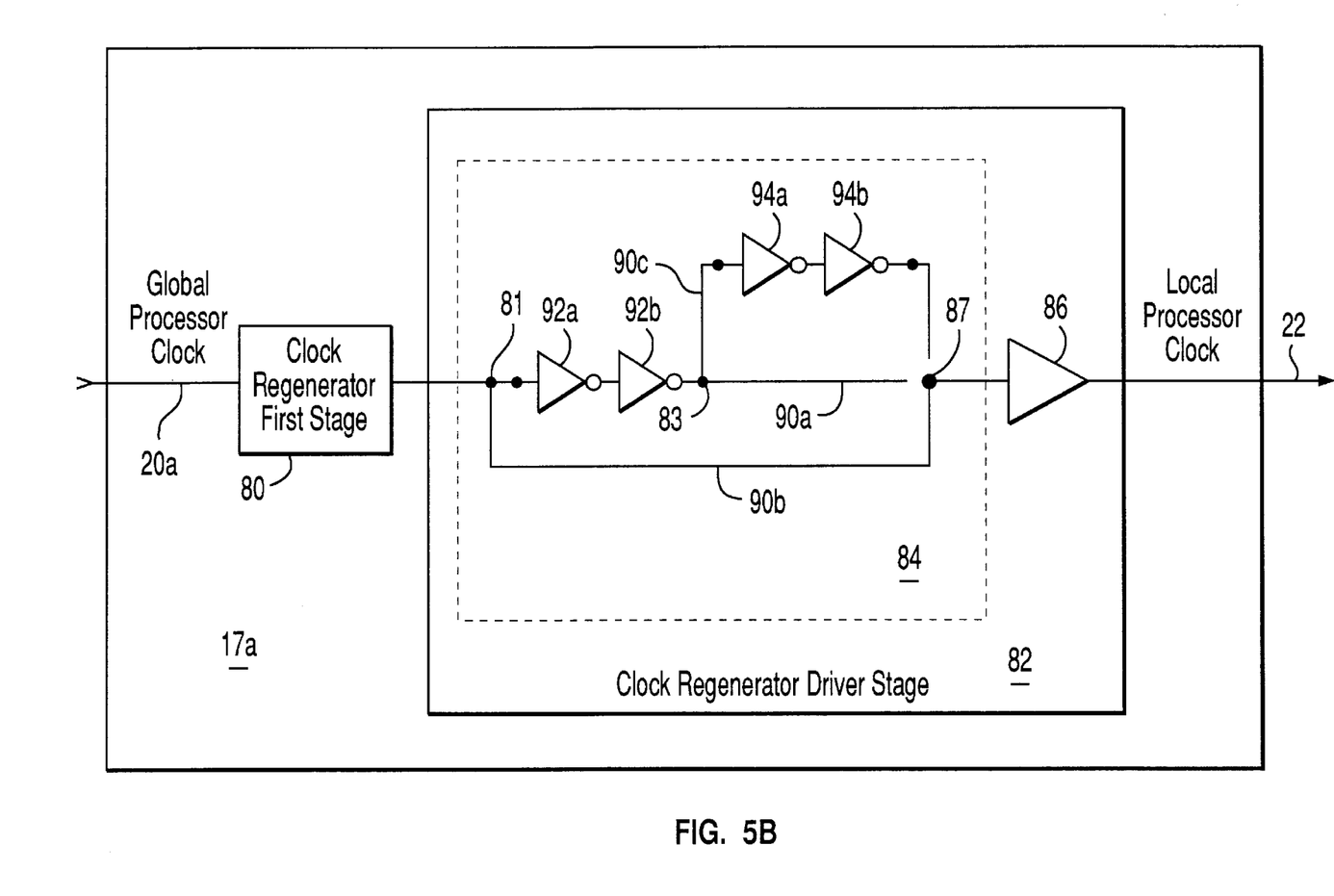
Figure 5C:
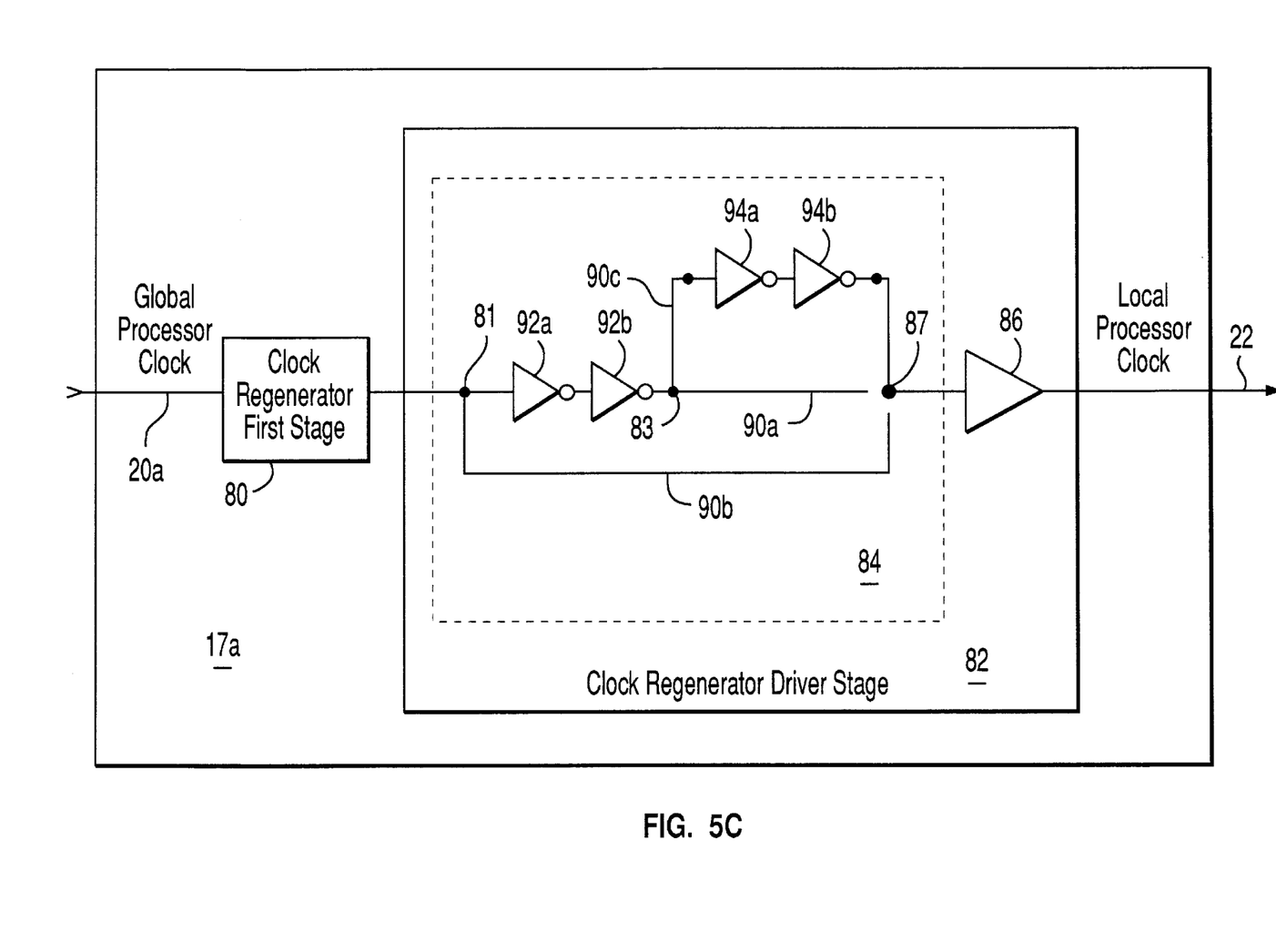

For example, FIGS. 5a–c show alternative versions of clock regenerator 17a. As shown in FIGS. 5a–c, clock regenerator 17a includes a clock regenerator first stage 80 and a clock regenerator driver stage 82. Significantly, driver stage 82 includes a reserved metallization area, indicated by dashed enclosure 84, and driver circuitry 86. Driver circuitry 86 includes a first complementary metal oxide semiconductor ("CMOS") inverter (p channel width=10 microns, n channel width=5 microns) serially connected to a second CMOS inverter (p channel width=30 microns, n channel width=15 microns). For clarity, FIGS. 5a–c show only the one of lines 22 which is connected to the input of the L2 latch of L1/L2 latch 14a.

Within reserved metallization area 84, as shown in FIGS. 5a–c, three alternative metallization paths 90a–c are available for selection manually by an integrated circuitry design engineer or automatically by a computerized design tool in order to skew the local processor clock signal output from clock regenerator 17a to the input of the L2 latch of L1/L2 latch 14a, as for example in the manner discussed hereinabove in connection with FIG. 4 for clock regenerators 17b and 17c. Global level circuitry of the integrated circuitry of system 10 is arranged to avoid interference with metallization paths 90a–c. Accordingly, reserved metallization area 84 is reserved within a blockage map of the integrated circuitry of system 10, so that global level circuitry (e.g. circuitry which is commonly connected to hundreds of components within the integrated circuitry of system 10) does not interfere with reserved metallization area 84.

More particularly, FIG. 5a illustrates selection of default metallization path 90a, such that path 90a is connected to a node 87, and paths 90b and 90c are disconnected from node 87. Accordingly, in FIG. 5a, clock regenerator first stage 80 is coupled through default metallization path 90a to driver circuitry 86. As shown in FIG. 5a, default metallization path 90a includes CMOS inverters 92a–b which operate as delay elements within path 90a. Inverters 92a–b are coupled in series between nodes 81 and 83, and node 83 is connected along path 90a to node 87.

By comparison, FIG. 5b illustrates selection of faster clock metallization path 90b, such that path 90b is connected to node 87, and paths 90a and 90c are disconnected from node 87. Accordingly, in FIG. 5b, clock regenerator first stage 80 is coupled through faster clock metallization path 90b to driver circuitry 86. As shown in FIG. 5b, faster clock metallization path 90b does not include inverters 92a–b, nor any other delay elements. Node 81 is connected along path 90b to node 87.

Consequently, path 90b (FIG. 5b) is faster than path 90a (FIG. 5a). This is because inverters 92a–b in path 90a operate to delay a clock signal output from first stage 80 through driver stage 82 to line 22. In this manner, the signal output to line 22 in FIG. 5a is time-delayed relative to the signal output to line 22 in FIG. 5b.

Thus, the local processor clock signal output (through line 22 to the input of the L2 latch of L1/L2 latch 14a) from clock regenerator 17a in FIG. 5b is clock skewed relative to the local processor clock signal output from clock regenerator 17a in FIG. 5a. Accordingly, the local processor clock signal output from clock regenerator 17a in FIG. 5b is accelerated (similar to waveform 66 in FIG. 4), whereas the local processor clock signal output from clock regenerator 17a in FIG. 5a is not accelerated (similar to waveform 62 in FIG. 4).

Further, FIG. 5c illustrates selection of slower clock metallization path 90c, such that path 90c is connected to node 87, and paths 90a and 90b are disconnected from node 87. Accordingly, in FIG. 5c, clock regenerator first stage 80 is coupled through slower clock metallization path 90c to driver circuitry 86. As shown in FIG. 5c, slower clock metallization path 90c includes CMOS inverters 92a–b and 94a–b which operate as delay elements within path 90c. Inverters 94a–b are coupled in series between nodes 83 and 87. Each of inverters 92a–b and 94a–b includes a respective p channel field effect transistor having a channel width=4 microns and a respective n channel field effect transistor having a channel width=2 microns.

Consequently, path 90c (FIG. 5c) is slower than path 90a (FIG. 5a). This is because inverters 94a–b in path 90c operate to further delay a clock signal output from first stage 80 through driver stage 82 to line 22. In this manner, the signal output to line 22 in FIG. 5c is time-delayed relative to the signal output to line 22 in FIG. 5a.

Thus, the local processor clock signal output (through line 22 to the input of the L2 latch of L1/L2 latch 14a) from clock regenerator 17a in FIG. 5c is clock skewed relative to the local processor clock signal output from clock regenerator 17a in FIG. 5a. Accordingly, the local processor clock signal output from clock regenerator 17a in FIG. 5c is delayed (similar to waveform 68 in FIG. 4), whereas the local processor clock signal output from clock regenerator 17a in FIG. 5a is not delayed (similar to waveform 62 in FIG. 4). Inverters 92a–b and 94a–b are sized comparably to one another.

Accordingly, relative to FIG. 5a, the metallization delay in FIG. 5b is changed from approximately two inverter delays to approximately zero inverter delays. Likewise, relative to FIG. 5a, the metallization delay in FIG. 5c is changed from approximately two inverter delays to approximately four inverter delays. In alternative embodiments, longer inverter chains (e.g. more than four inverters) are implemented for even longer delays and larger clock skew adjustments. Of course, actual inverter delays in any particular embodiment are process technology-dependent.

Notably, each of alternate metallization paths 90a–c is connected to clock regenerator first stage 80 in each of the examples of FIGS. 5a–c. Consequently, the capacitive loading upon clock regenerator first stage 80 by clock regenerator driver stage 82 is substantially unchanged by selection between different ones of alternate metallization paths 90*a–c*. Accordingly, such capacitive loading is substantially unchanged between the examples of FIG. 5*a* (selection of path 90*a*), FIG. 5*b* (selection of path 90*b*), and FIG. 5*c* (selection of path 90*c*).

Accordingly, nodes 81 and 87 input and output the clock signal from clock regenerator first stage 80. Multiple paths 90*a–c* are each connectable between nodes 81 and 87 for delaying the clock signal by a respective amount of time between nodes 81 and 87. For example, the respective amount of time for path 90*a* is approximately two inverter delays, the respective amount of time for path 90*b* is approximately zero inverter delays, and the respective amount of time for path 90*c* is approximately four inverter delays.

Since each of paths 90*a–c* is selectively connectable to node 87 as discussed further hereinabove (e.g. in FIG. 5*a*, path 90*a* is connected to node 87, and paths 90*b* and 90*c* are disconnected from node 87), a technique is provided for coupling node 81 through a selected one of paths 90*a–c* to node 87 so that the clock signal at node 87 is always delayed relative to the clock signal at node 81 by the respective amount of time of the selected path. The clock signal at node 87 is always delayed relative to node 81, because nodes 81 and 87 and metallization paths 90*a–c* are manufactured in a permanent configuration during fabrication of the single integrated circuit of system 10.

As discussed further hereinabove, clock regenerator 17*a* is a representative one of clock regenerators 17*a–n*. Thus, each of clock regenerators 17*a–n* has respectively associated first and second nodes (e.g. nodes 81 and 87 associated with clock regenerator 17*a*) and associated metallization paths (e.g. paths 90*a–c* associated with clock regenerator 17*a*).

Figure 6:
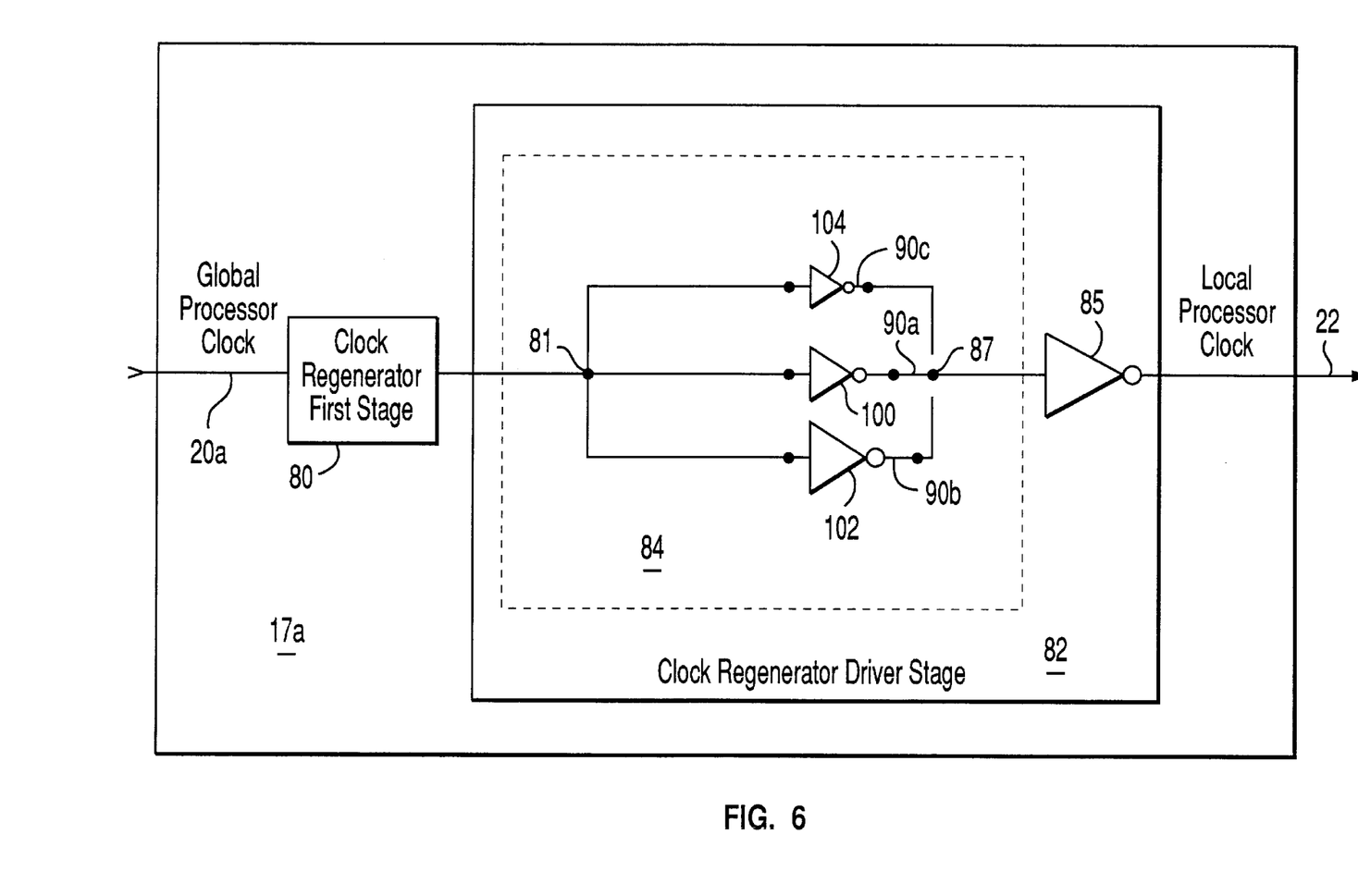
FIG. 6 is an electrical circuit diagram of a clock regenerator according to a clock skew optimization technique of a second illustrative embodiment.

FIG. 6 is an electrical circuit diagram of clock regenerator 17*a* according to a clock skew optimization technique of a second illustrative embodiment. As shown in FIG. 6, inverters 92*a–b* (FIG. 5*a*) along default metallization path 90*a* are replaced by a single CMOS inverter 100 which includes a p channel field effect transistor having a channel width=10 microns and an n channel field effect transistor having a channel width =5 microns. Similarly, as shown in FIG. 6, the combination of inverters 92*a–b* and 94*a–b* (FIG. 5*c*) along slower clock metallization path 90*c* is replaced by a single CMOS inverter 104 which includes a p channel field effect transistor having a channel width=6 microns and an n channel field effect transistor having a channel width=3 microns.

As shown in FIG. 6, faster clock metallization path 90*b* is routed as in FIG. 5*b*, but slower clock metallization path 90*c* is routed differently than in FIG. 5*c*. Further, as shown in FIG. 6, a single CMOS inverter 102 is inserted along faster clock metallization path 90*b*. Inverter 102 includes a p channel field effect transistor having a channel width=20 microns and an n channel field effect transistor having a channel width=10 microns. In FIG. 6, driver circuitry 86 is replaced by a single CMOS driving inverter 85 including a p channel field effect transistor having a channel width=30 microns and an n channel field effect transistor having a channel width=15 microns.

According to this second illustrative embodiment of FIG. 6, inverter 104 along slower clock metallization path 90*c* is smaller and slower (i.e. increases the delay in a signal which propagates through the inverter) than inverter 100 along default metallization path 90*a*. Conversely, inverter 102 along faster clock metallization path 90*b* is larger and faster (i.e. reduces the delay in a signal which propagates through the inverter) than inverter 100 along default metallization path 90*a*. FIG. 6 illustrates selection of default metallization path 90*a*, such that path 90*a* is connected to node 87, and paths 90*b* and 90*c* are disconnected from node 87.

In FIG. 6, a slightly underpowered or overpowered inverter (e.g. one of inverters 100, 102 and 104) is selectable in order to vary the clock output timing (i.e. adjust clock skew) with a finer degree of resolution than in FIGS. 5*a–c*. Notably, the technique of FIG. 6 does not preclude implementation of load-balanced clock regenerators. In such a situation, each clock regenerator's respective driver stage (e.g. driver stage 82 of clock regenerator 17*a*) is modified to achieve the metallization-programmable delay while matching the capacitive load on the clock signal.

Figure 7:
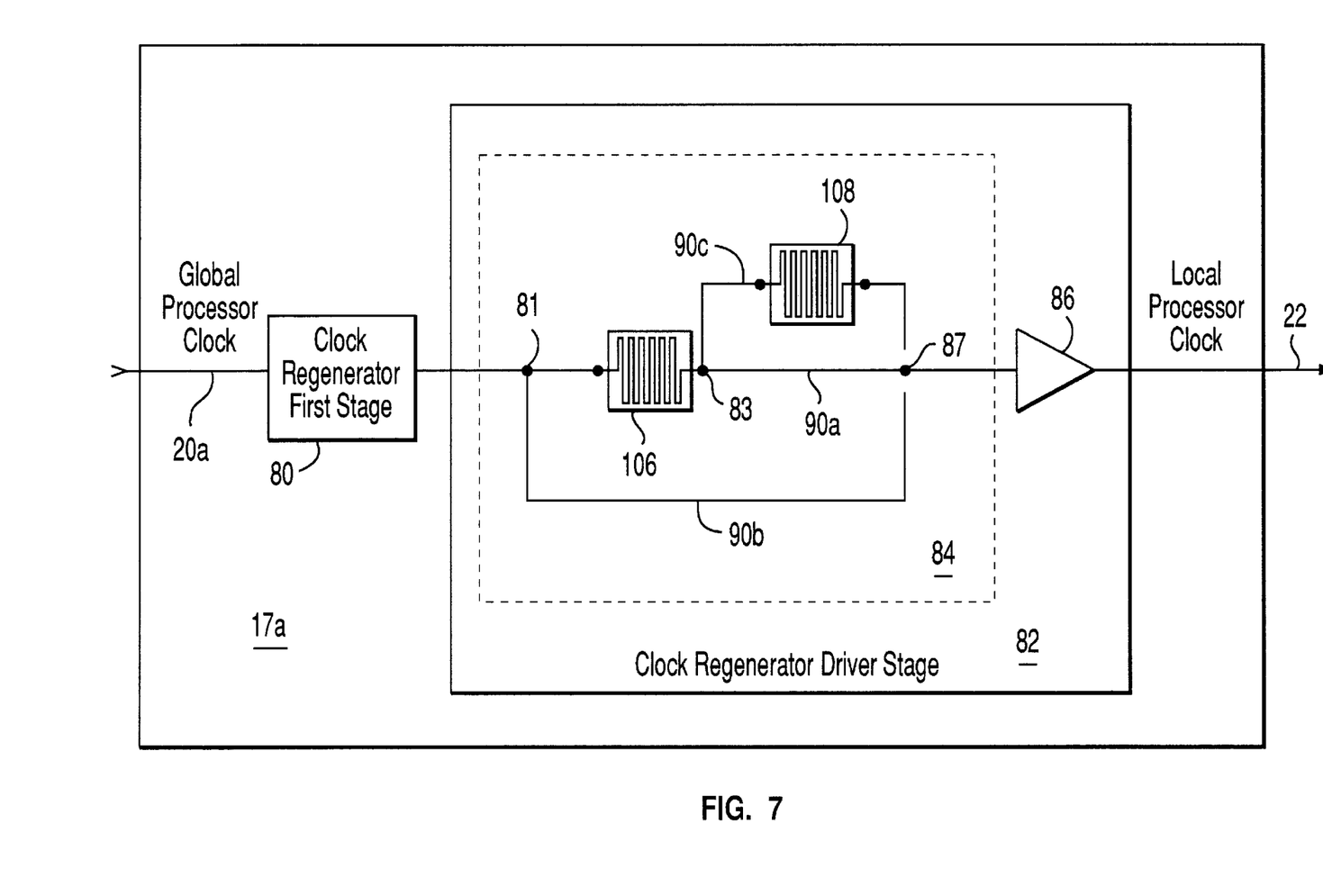
FIG. 7 is an electrical circuit diagram of a clock regenerator according to a clock skew optimization technique of a third illustrative embodiment.

FIG. 7 is an electrical circuit diagram of clock regenerator 17*a* according to a clock skew optimization technique of a third illustrative embodiment. As shown in FIG. 7, inverters 92*a–b* (FIG. 5*a*) along default metallization path 90*a* are replaced by a metallization delay element 106. Similarly, as shown in FIG. 7, inverters 94*a–b* (FIG. 5*c*) along slower clock metallization path 90*c* are replaced by a metallization delay element 108.

As shown in FIG. 7, slower clock metallization path 90*c* is routed as in FIG. 5*c*, and faster clock metallization path 90*b* is routed as in FIG. 5*b*. In FIG. 7, driver circuitry 86 is substantially identical in design and implementation to driver circuitry 86 of FIGS. 5*a–c*. FIG. 7 illustrates selection of default metallization path 90*a*, such that path 90*a* is connected to node 87, and paths 90*b* and 90*c* are disconnected from node 87.

As illustrated in FIG. 7, metallization delay element 106 includes a preselected length of metallization within the integrated circuitry of system 10 (FIG. 1). If the length of metallization is preselected to be longer, then metallization delay element 106 achieves a longer delay. Similarly, if the length of metallization is preselected to be shorter, then metallization delay element 106 achieves a shorter delay.

In this manner, the length of metallization is preselectable so that metallization delay element 106 achieves a delay suitable for a particular situation. Likewise, various preselectable delays are achievable using metallization delay element 108. The preselected length of metallization is geometrically arranged and laid out within the integrated circuitry of system 10 in a suitable manner, such that space utilization within the integrated circuitry is substantially optimized.

The space utilization is in accordance with allowed space constraints of the integrated circuitry. For example, if each of metallization delay elements 106 and 108 has a respective preselected length of metallization which is relatively short, then a +/−10 ps clock skew adjustment is achievable with clock regenerator 17*a* of FIG. 7. If a greater clock skew adjustment is needed for a particular situation, and if space is not readily available within the integrated circuitry to extend the preselected lengths of metallization, the clock skew adjustment technique of FIG. 7 can be replaced or supplemented by one or more of the clock skew adjustment techniques described further hereinabove in connection with FIGS. 5*a–c* and 6.

Relative to the embodiment of FIG. 6, the embodiment of FIG. 7 occupies comparable space, yet provides a clock skew adjustment of only approximately +/−20 ps with minimum width metallization. By comparison, the embodiment of FIG. 6 achieves a clock skew adjustment of approximately +/−100 ps. But the embodiment of FIGS. 5*a–c* achieves an even better clock skew adjustment of approximately +/−150 ps and is very space efficient because the extra inverters (e.g. 92*a–b* and 94*a–b*) are relatively small.

To summarize, inside a local device (e.g. clock regenerator 17a or a latch or a register) on the integrated circuitry of system 10, local metallization-programmable delays are selectable by selecting between alternate metallization paths 90a–c. The techniques of the illustrative embodiments enable such selections to be made simultaneously for multiple local devices, with such selections being made individually at each local device independent of selections made for other local devices. Advantageously, since the selections are made within local devices, routing of global clock's metallization is unaffected.

With the techniques of the illustrative embodiments, it is practical to select between alternate metallization paths 90a–c of clock regenerator 17a (and likewise to select between other clock regenerators' respectively associated alternate metallization paths) as a final automated step with a computerized design tool immediately before attempts to fabricate the integrated circuitry, so that clock skew is substantially optimized. Accordingly, the fastest possible cycle time of the integrated circuitry of system 10 is more readily achieved, and clock skew optimization is more practically achieved at more stages of an integrated circuitry project. This is true even near the end of such a project without time-consuming changes to pre-established routing of global clock metallization.

A first reason for this is because selection between alternate metallization paths 90a–c is made in a manner which is transparent to higher level circuitry. A second reason is because clock skew optimization is more readily automated as part of a computerized design tool, so clock skew optimization is more readily achievable for more worst case paths on the integrated circuitry of system 10 in a shorter period of time relative to previous techniques. In automating clock skew optimization, a computer program is executed by a computerized design tool to search a timing database and automatically select between alternate metallization paths 90a–c in response thereto. With the computerized design tool implemented on a computer for executing such an automated computer program, substantially optimal clock skew modifications are achieved automatically for critical timing paths within the integrated circuitry of system 10.

Selection (manual or automated) between alternate metallization paths 90a–c is significantly easier than modifying H-tree routing circuitry 30 (FIG. 3) for one or more critical timing paths within the integrated circuitry of system 10. As an example of such modifications to H-tree routing circuitry 30, a modified version of H-tree routing circuitry 30 is designed and implemented so that the global processor clock signal propagates differently through particular ones of lines 20a–n and is received by particular ones of clock regenerators (e.g. 17a–n) at different moments in time. Such a modified version of H-tree routing circuitry 30 is designed and implemented to unevenly distribute the global processor clock signal to particular clock regenerators (e.g. 17a–n) through particular ones of lines 20a–n, such that particular ones of lines 20a–n have different lengths between their respectively connected clock regenerator and global processor clock node 50. Thus, in such a modified version of H-tree routing circuitry 30, there is clock skew between arrival times of the global processor clock signal at the respective inputs of particular ones of clock regenerators 17a–n, so that particular ones of clock regenerators 17a–n input the global processor clock signal at different moments in time.

By comparison, in the integrated circuitry of system 10, clock skew is substantially optimized on a more localized basis by selecting between alternate metallization paths (e.g.metallization paths 90a–c) within a clock regenerator (e.g. clock regenerator 17a). Notably, a clock regenerator within a synthesized block of logic is capable of outputting a common clock signal to multiple latches which are connected to the clock regenerator. Selection between alternate metallization paths 90a–c adjusts the clock timing to all such latches.

Significantly, an even finer degree of resolution is achievable by further implementing the techniques of FIGS. 5a–c, 6 or 7 at one or more latches connected to clock regenerator 17a. In this manner, clock skew is substantially optimized on an even more localized basis for a particular latch. Thus, in addition to being used with clock regenerators, the techniques of FIGS. 5a–c, 6 and 7 are useful with latches.

Nevertheless, the integrated circuitry of system 10 includes many more latches than clock regenerators. Consequently, an increase in the layout size of a standard latch is more likely to significantly impact a floorplan of the integrated circuitry of system 10, particularly in comparison to the impact of an increase in the layout size of a standard clock regenerator. Accordingly, it may be suitable in some situations to achieve such a latch modification using metallization delay elements (e.g. metallization delay elements 106 and 108) in the manner described further hereinabove in connection with FIG. 7.

A consideration in adjusting clock skew is the possibility of inadvertently creating "fast paths" within the integrated circuitry of system 10. For example, a "fast path" could result if (a) in response to a relatively fast local clocking signal from clock regenerator 17a, the L2 latch of L1/L2 latch 14a outputs a signal through logic stage 12a to the L1 latch of L1/L2 latch 14b while (b) in response to a relatively slow local clocking signal from clock regenerator 17b, the L1 latch of L1/L2 latch 14b inputs the signal from logic stage 12a one clock cycle too early. Such a "fast path" could result in a functional operation failure within the integrated circuitry of system 10.

Fast paths are avoidable by using a computerized design tool implemented on a computer. For example, in designing the integrated circuitry of system 10, an engineer uses the computer to execute an automated timing analysis computer program to detect such fast paths and to appropriately select between alternate metallization paths (e.g.metallization paths 90a–c) within clock regenerators (e.g. clock regenerator 17a), so that fast paths are avoided. Also, the likelihood of fast paths is reduced by limiting clock skew to 5% or less of the global processor clock signal's normal cycle time.

Although an illustrative embodiment of the present inventions and their advantages have been described in detail hereinabove, it has been described as example and not as limitation. Various changes, substitutions and alterations can be made in the illustrative embodiment without departing from the breadth, scope and spirit of the present inventions. The breadth, scope and spirit of the present inventions should not be limited by the illustrative embodiment, but should be defined only in accordance with the following claims and equivalents thereof.

What is claimed is:

1. An integrated circuit clock adjusting apparatus, comprising:

a source of master clock signals;

a first clock signal generator circuit, connected to receive master clock signals at an input node and to generate a first clock signal with a first delay at an output node, the first delay defined by a regenerator circuit metallization creating one of at least three possible different metallization selectable incremental delays available within the first clock signal regenerator circuit;

a first latch responsive to the first clock signal for latching logic signals outputted from a first logic circuit;

a second clock signal regenerator circuit, connected to receive master clock signals at an input node and to generate a second clock signal with a second delay at an output node, the second delay defined by a regenerator circuit metallization creating one of at least three possible different metallization selectable incremental delays available within the second clock signal generator circuit, the second delay of the second clock signal regenerator circuit differing from the first delay of the first clock signal regenerator circuit; and a second latch responsive to the second clock signal for latching logic signals received from said first latch via a second logic circuit.

2. The apparatus of claim 1 wherein said second clock signal is delayed so that clock skew is substantially optimized between the first and second logic circuits.

3. The system of claim 2 wherein said master clock signal is a processor clock signal.

* * * * *